Sept. 25, 1973 G. P. WECKLER 3,761,326

PROCESS FOR MAKING AN OPTIUM HIGH GAIN-BANDWIDTH PHOTOTRANSISTOR STRUCTURE

Original Filed July 28, 1969

United States Patent Office 3,761,326
Patented Sept. 25, 1973

3,761,326

PROCESS FOR MAKING AN OPTIMUM HIGH GAIN-BANDWIDTH PHOTOTRANSISTOR STRUCTURE

Gene P. Weckler, Campbell, Calif., assignor to Fairchild Camera and Instrument Corporation, Mountain View, Calif.

Original application July 28, 1969, Ser. No. 845,303, now abandoned. Divided and this application May 20, 1971, Ser. No. 145,486
Int. Cl. H01l *5/00, 7/64, 15/06*
U.S. Cl. 148—175 3 Claims

ABSTRACT OF THE DISCLOSURE

The fabrication of two semiconductor structures such as a high speed, optimum sensitivity photodiode and a maximum gain-bandwidth transistor on the same wafer is described. A thin, low resistivity layer is formed on a higher resistivity substrate and the diode junction is then formed in one part of the wafer by diffusing the junction-forming region through the layer and down into the substrate. This provides a diode of low capacitance and optimum light sensitivity. The transistor is then formed in another part of the same wafer by first diffusing the base-collector junction into the thin layer followed by a diffusion therein of the emitter-base junction. This diffusion into the layer is very shallow and results in a high gain-bandwidth transistor. The photodiode structure is affected very little by the processing required to form the transistor, thus allowing each structure to be independently optimized.

CROSS-REFERENCE TO RELATED APPLICATIONS

This is a division of patent application Ser. No. 845,303, filed July 28, 1969, now abandoned in favor of continuation application 155,363, filed June 21, 1971, now U.S. Patent No. 3,677,280 issued July 18, 1972, by Gene P. Weckler.

BACKGROUND OF THE INVENTION

The field of solid state optoelectronics, i.e., light sensing and emitting devices, is rapidly expanding and, as the operating characteristics of these devices such as speed, efficiency, light sensitivity, and gain-bandwidth improve, their applications increase in number and size.

As an example, recent developments have led to PIN photodiodes with very fast rise times in the one to five nanosecond range ideally suited for tachometers, flying spot scanners and star tracking. One such improved PIN photodiode structure is described and claimed in U.S. Patent 3,532,945 entitled, "Semiconductor Devices Having Low Capacitance Junction and Methods for Their Fabrication," issued Oct. 6, 1970, and assigned to the same assignee as the present application.

Each of the individual devices utilized in a particular combination or package, such as a photodiode and transistor amplifier or an emitter-photodiode coupler and associated transistor amplifier, is independently processed as a discrete component, with the desired individual characteristics optimized. In a photodiode-transistor combination, the photodiode is processed so as to have fast speed and optimum light sensitivity whereas the transistor is processed for the highest gain-bandwidth figure of merit. The devices are thereafter separately mounted and coupled together by external cables or leads.

The problems encountered in the mounting and electrical interconnecting of these devices are significant, particularly as the use of multiple devices in linear and area arrays increases.

Although the need for an integrated device, i.e., a photodiode and transistor on the same semiconductor wafer, has existed for some time, it was believed that these devices could not be realized on the same substrate if they were to maintain their optimized operating characteristics.

SUMMARY OF THE INVENTION

It is an object of the present invention to provide an integrated semiconductor device and method for its manufacture whereby a high speed, optimized light sensitive photodiode and a high gain-bandwidth product transistor are made on the same semiconductor substrate, the electrical connection between the base regions of the two structures being accomplished by a metal-over connection on the surface of the wafer or by an internal overlap of the two diffused base regions.

In its manufacture a very thin layer of low resistivity material is formed as by epitaxial growth on a substrate of the same type conductivity and of high resistivity. The deep base region of the photodiode is then diffused through the thin layer and well into the substrate, forming a low capacitance base-collector junction with optimized light sensitivity. Thereafter, the shallow base region of the transistor is diffused into the thin layer followed by a diffusion of the emitter region, the shallow transistor providing a high gain-bandwidth value. The processing of the transistor has no appreciable effect on the photodiode structure.

This integrated structure provides optimum matching between the two structures and eases the problems encountered in mounting and interconnecting the devices in complex arrays and matrices. It also lends itself to the formation of improved sealed combinations of light emitter and sensor, for example, a matched galium arsenide light-emitting diode and the integrated semiconductor device of the present invention comprising a silicon photodiode and transistor. This package would provide a high degree of isolation along with high frequency operation. The combination of high speed and voltage isolation finds good use in video pulse-transformer replacements and for data transfer when ground loops could cause problems.

DETAILED DESCRIPTION OF THE DRAWINGS

Figures 1, 2, 3, 4, 5, 6, 7, 8, 9:
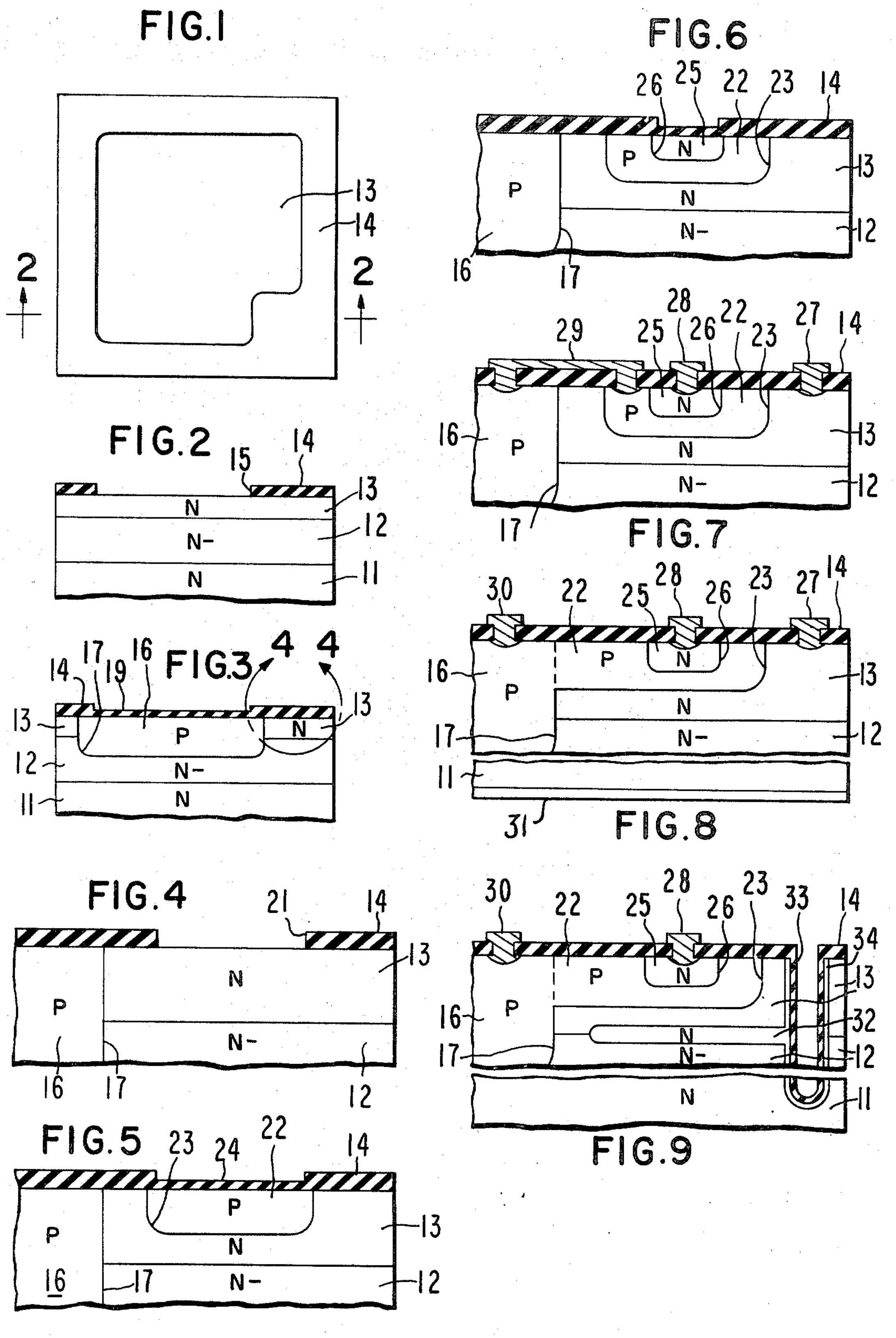
FIG. 1 is a plan view of the top of a wafer prior to the formation thereon of the photodiode and transistor devices.
FIGS. 2 through 6 are cross-sectional views taken through the wafer of FIG. 1 along section line 2—2 showing the wafer during the progressive steps of manufacture resulting in the formation of the photodiode and transistor devices, FIGS. 4 through 6 showing the transistor section of the wafer represented by section line 4—4 in FIG. 3.
FIG. 7 is a cross-section view of the integrated structure showing an external connection between the base region of the photodiode and the base region of the transistor.
FIG. 8 is a cross-section of the device showing the base regions of the photodiode and the transistor connected by diffusion.
FIG. 9 is a cross-section view of the transistor area of another embodiment of the novel integrated structure of the present invention.

Referring to FIGS. 1 and 2, the manufacture of the integrated semiconductor device of the present invention is initiated with the formation of a heavily doped substrate 11 of semiconductor material such as a wafer sliced from an ingot of grown N type silicon having, for example, greater than $10^{18}$ donors per cubic centimeter and with a resistivity of .01 to .05 ohm-centimeters.

The semiconductor devices of the present invention are made by standard processes well-known in the art of photodiode and transistor manufacture, including epitaxial crystal growth, masking, chemical etching, diffusion of impurities, etc. and these standard processes will not be described in detail herein. Reference may be had to published texts on this subject as well as to numerous published patents, including U.S. Patent 3,025,589, issued to J. A. Hoerni on Mar. 20, 1962, entitled, "Method of Manufacturing Semiconductor Devices," and U.S. Patent 2,981,877, issued to R. N. Noyce on Apr. 25, 1961, entitled, "Semiconductor Device-and-Lead Structure."

An additional substrate 12 is epitaxially grown on the substrate 11 of the same N type silicon but having a much higher resistivity, on the order of 50 to 200 ohm-centimeters, preferably near the high end of the range, and with a thickness of the order of 25 microns. This high resistivity material is referred to as N-type to distinguish it from the more conductive N-type material. It should be noted that the figures shown in the drawings have not been drawn to scale due to the gross difference in the geometry of the composite parts.

A thin surface layer 13 of N type material is then epitaxially grown on the substrate 12, this layer being of the order of 2 to 5 microns thick and its resistivity being of the order of 1 to 10 ohm-centimeters, preferably near the low end of that range. A minimum resistivity of about 1 ohm-centimeter is preferred to provide adequately high breakdown voltage values. At least one or two orders of magnitude difference in the resistivities of layers 12 and 13 is desirable.

Epitaxial growth has been utilized to form both the substrate 12 and layer 13 rather than diffusion of impurities since the resistivity will be controlled within closer limits and high surface concentrations are avoided due to the regulation possible in epitaxial growth techniques.

The layer 13 has an insulating coating or oxide layer 14 formed thereon which is subsequently made into a mask by the production of a diffusion opening 15 therein. As viewed in FIG. 1, the mask covers the lower right hand corner of the wafer surface where the transistor structure is to be subsequently formed, the major surface area of layer 13 being exposed for the diffusion of the base region of the photodiode.

As the next step, a graded base region 16 of opposite conductivity, i.e., P-type material, is formed by the diffusion of a quantity of acceptor impurities through the layer 13 and well into the substrate 12 producing a base-collector junction 17 with a depth of the order of 5 to 10 microns. In the diffusion process, a thin insulating layer 19 of silicon oxide is formed over the surface of the base region. Because of the thinness and controlled resistivity of the thin layer 13, its thickness may be considered unchanged following the diffusion of the deep base region. The doping agent for the thin layer may be one, such as antimony for an N-type layer, having a low diffusion constant to minimize changes during subsequent diffusion operations.

A PIN diode structure is thus formed over the major portion of the wafer. The high resistivity of the collector region and the graded or non-uniform impurity distribution nature of the base region insures a low base-collector junction capacity and a high speed operation for the photodiode which is mesured in nanoseconds. In addition, the controlled depth of the collector-base junction may be optimized for maximum light sensitivity to selected light sources such as tungsten or gallium arsenide.

The layer 13 of epitaxial material stabilizes the surface of the diode and reduces the surface leakage current which normally occurs in devices made on high resistivity material. This surface stabilization results from the fact that the surfaces of low resistivity material are less affected by contamination and by standard processing than are surfaces of high resistivity material. Because the layer 13 is so thin, it contributes negligible capacitance to the diode, and also limits the space charge volume to only a negligible extent.

Referring now to FIGS. 4 through 6 which are enlarged cross-section views of the lower right hand corner of the wafer of FIG. 1, an opening 21 is made in the masking layer 14 and the P-type base region 22 for the transistor structure is diffused into the thin layer 13 to form a base-collector junction 23. This base-collector junction 23 is very shallow relative to the deep base-collector junction 17 of the diode, being of the order of 1 to 2 microns. During the diffusion of the base 22, an oxide coating 24 is formed on the surface. A suitable sized opening is made in the coating 24 and an N-type emitter region 25 is then diffused into the base region to form an emitter-base junction 26. This transistor is made in accordance with standard transistor processing techniques to insure a high gain-bandwidth characteristic. The processing of the transistor is independent of the processing of the diode and the operating characteristics of the transistor may be optimized independently of the diode. On the other hand, the optimized characteristics of the diode structure are not affected by or changed during the shallow base and emitter diffusion of the transistor.

Referring to FIG. 7, as a last step, good ohmic contacts 27 and 28 are made to the collector region 13 and the emitter region 25 of the transistor while a metal-over contact 29 connects the base 16 of the diode to the base 22 of the transistor. In lieu of a metal-over contact 29, the connection between the two base regions may be made during the diffusion of the transistor base 22 by diffusing this base into the diode base 16 as shown in FIG. 8. A single external ohmic contact 30 may be made to the back or underside of the wafer. By making two collector connections, one to the backside of the substrate, the other to the epitaxial layer 13 is in the region near the transistor, the series collector resistance is minimized and independent of operating voltage.

An important advantage of this integrated structure is that it may be operated at low voltages without suffiering a loss of performance as is the case for a NPIN structure when it is operated below its reach-through voltage.

Another embodiment of the present invention is seen in FIG. 9 wherein a cross-section view of the transistor section of the integrated semiconductor device is shown. A very thin buried layer 32 of heavily doped, high conductivity N-type material is formed in the transistor corner of the wafer between the substrate 12 and the thin layer 13. This layer 32 is formed by a predeposition of N-type material onto layer 12 before thin layer 13 is grown, the buried layer diffusing into the boundary between the two layers 12 and 13 during growth of the layer 13.

A pocket 33 is formed in the corner of the wafer, the pocket being L-shaped and extending along the two sides of the lower right hand corner of the wafer as viewed from FIG. 1. The pocket is formed by etching, preferably just after the P-type region 16 has been diffused into the diode region of the water.

After the N-type region 25 has been diffused into the transistor, the oxide coating is removed from the walls of the pocket 33 and the pocket left open during the standard phosphorus gettering or emitter level predeposition step utilized in the semiconductor manufacture. This results in the formation of a thin surface layer 34 of heavily doped N-type material in the pocket. The buried layer 32 and pocket surface layer 34 give a high conductivity path and thus a low series collector resistance path. The collector contact is made to the backside of the wafer.

It will be apparent to those skilled in this art that the various regions in the semiconductor may be reversed in conductivity, such as the formation of an NIP diode and PNP transistor. Furthermore, it should be noted that the shape of pocket 33 formed in the corner of the wafer, although conveniently L-shaped, is not important.

What is claimed is:

1. A method of making a semiconductor device having a photodiode and a transistor on the same wafer, said method comprising:

forming a semiconductor wafer including at least a first layer of high resistivity semiconductor material of one conductivity type formed on a second layer of lower resistivity semiconductor material of the same conductivity type; forming epitaxially a surface layer of low resistivity material of said one conductivity type upon said first layer;

forming a diode in one portion of said wafer by diffusing a region, of conductivity type opposite to that of said one conductivity type, that extends through said surface layer in said one portion of the wafer and into said first layer, said diffused region forming with said surface layer and said first layer a semiconductor junction; and forming a transistor in another separate portion of said wafer by diffusing a first region, of conductivity type opposite to that of said one conductivity type, that extends into said surface layer in said other portion of the wafer and terminates short of said first layer, said diffused region and said surface layer forming a semiconductor junction, and diffusing another region of said one conductivity type that extends into said first region and forms a semiconductor junction with said region.

2. The method as claimed in claim 1 wherein the step of forming the semiconductor wafer includes forming the said first layer with a resistivity of the order of 50 to 200 ohm-centimeters and the step of forming said surface layer includes epitaxially growing said surface layer with a resistivity of the order of 1 to 10 ohm-centimeters.

3. The method as claimed in claim 2 wherein the step of forming said surface layer includes epitaxially growing said surface layer with a thickness of the order of 2 to 5 microns, the step of forming said diode includes diffusing said regions of opposite conductivity type to a depth of the order of 5 to 10 microns, and the step forming said transistor includes diffusing said first region of opposite conductivity into said surface layer to a depth of the order of 1 to 2 microns.

References Cited

UNITED STATES PATENTS

| | | | |
|---|---|---|---|
| 3,307,984 | 3/1967 | Frazier | 148—187 |
| 3,460,009 | 8/1969 | Kisinko et al. | 317—235 |
| 3,378,915 | 4/1968 | Zenner | 29—577 |
| 3,486,029 | 12/1969 | Barrett et al. | 317—235 D |
| 3,532,945 | 10/1970 | Weckler | 317—235 |
| 3,555,374 | 1/1971 | Usuda | 317—235 R |
| 3,639,815 | 2/1972 | Ernick et al. | 317—235 R |

FOREIGN PATENTS

| | | | |
|---|---|---|---|
| 1,230,132 | 12/1966 | Germany | 317—235 |

L. DEWAYNE RUTLEDGE, Primary Examiner

W. G. SABA, Assistant Examiner

U.S. Cl. X.R.

29—572, 577, 580; 117—213; 148—187; 317—235 R